(12) United States Patent
Inaba et al.

(10) Patent No.: US 7,237,167 B2
(45) Date of Patent: *Jun. 26, 2007

(54) TESTING APPARATUS

(75) Inventors: Kenji Inaba, Tokyo (JP); Masashi Miyazaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 210 days.

This patent is subject to a terminal disclaimer.

(21) Appl. No.: 10/773,562

(22) Filed: Feb. 6, 2004

(65) Prior Publication Data

US 2005/0193298 A1    Sep. 1, 2005

(51) Int. Cl.
  *G01R 31/28* (2006.01)
  *G06F 11/00* (2006.01)
  *G01R 27/28* (2006.01)

(52) U.S. Cl. .................... 714/740; 714/707; 714/744; 702/117

(58) Field of Classification Search ............... 714/740, 714/712
  See application file for complete search history.

(56) References Cited

U.S. PATENT DOCUMENTS

| 4,707,834 A * | 11/1987 | Frisch et al. ............... 714/31 |
| 6,028,439 A * | 2/2000 | Arkin et al. ............... 324/765 |
| 2004/0177303 A1* | 9/2004 | Miura ...................... 714/741 |
| 2005/0114550 A1* | 5/2005 | Kushnick ................... 709/248 |
| 2005/0240852 A1* | 10/2005 | Inaba et al. ................ 714/740 |

FOREIGN PATENT DOCUMENTS

| JP | 10-239396 | 9/1998 |
| JP | 2001-174526 | 6/2001 |
| JP | 2002-528706 | 9/2002 |
| JP | 2003-217299 | 7/2003 |

OTHER PUBLICATIONS

Japanese Office Action "Notification of Reasons and Refusal" issued in Japanese Application No. 2006-526016 mailed on Feb. 6, 2007 and English translation thereof, 6 pages.

* cited by examiner

*Primary Examiner*—Phung My Chung
(74) *Attorney, Agent, or Firm*—Osha•Liang LLP

(57) ABSTRACT

A testing apparatus including a plurality of testing module slots to which different types of testing modules for testing a device under test are optionally mounted, includes a first and a second testing modules, and a synchronization controlling unit. The synchronization controlling unit includes an operation order holding unit for holding information indicating that a test operation by a first testing module should be performed before a test operation by a second testing module, a trigger return signal receiving unit for receiving a trigger return signal from the first testing module, and a trigger signal supplying unit for supplying a trigger signal to the second testing module, the trigger signal indicating that the second testing module should start the test operation thereof, when the trigger return signal receiving unit receives the trigger return signal.

5 Claims, 4 Drawing Sheets

TESTING APPARATUS

BACKGROUND OF THE INVENTION

1. Field of the Invention

The present invention relates to a testing apparatus. More particularly, the present invention relates to a testing apparatus including a plurality of testing module slots to which different types of testing modules are optionally mounted.

2. Description of the Related Art

A testing apparatus for performing an analog test of a device under test performs the test by allowing one testing module to generate and supply a test signal to the device under test and another testing module to measure the output signal from the device under test. In order to realize the operations of such testing modules, the testing apparatus controls the testing modules synchronously, while supplying trigger signals to them based on a testing program which determines test sequences such as the operation order of the testing modules.

Recently, a testing apparatus including a plurality of testing module slots to which different types of testing modules for generating different types of test signals for the test of the device under test respectively are optionally mounted has been developed. In such testing apparatus, since the testing modules mounted to the plurality of testing module slots respectively are optionally changed, and the times required for the test operations for the test modules are different from each other, it is inevitable to make a testing program which corresponds to the mounting positions or the combination of the testing modules whenever the testing modules are changed, and it is necessary to prepare a process for a extremely difficult test.

SUMMARY OF THE INVENTION

Therefore, it is an object of the present invention to provide a testing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus including a plurality of testing module slots to which different types of testing modules for testing a device under test are optionally mounted, includes operation order holding means for holding information indicating that a test operation by a first testing module among the plurality of testing modules should be performed before a test operation by a second testing module among the plurality of testing modules, trigger return signal receiving means for receiving a trigger return signal from the first testing module, the trigger return signal indicating that the first testing module has completed the test operation thereof, when the test operation of the first testing module has been completed, and trigger signal supplying means for supplying a trigger signal to the second testing module, the trigger signal indicating that the second testing module should start the test operation thereof, when the trigger return signal receiving means receives the trigger return signal.

The first testing module may be an arbitrary wave form adjustor for generating and supplying an arbitrary analog waveform to the device under test, the second testing module may be a phase characteristics tester for receiving an analog waveform outputted by the device under test in response to the analog waveform supplied from the arbitrary waveform adjustor, and testing phase characteristics of the analog waveform, the operation order holding means may hold information indicating that the phase characteristics tester should perform a receiving operation of the analog waveform from the device under test, after the arbitrary waveform adjustor performs a supply operation of the analog waveform to the device under test, the trigger return signal receiving means may receive the trigger return signal from the arbitrary waveform adjustor, the trigger return signal indicating that the arbitrary waveform adjustor has completed the supply operation, when the supply operation at a predetermined time of the analog waveform has completed by the arbitrary waveform adjustor, and the trigger signal supplying means may supply the trigger signal to the phase characteristics tester, the trigger signal indicating that the phase characteristics tester should start the receiving operation of the analog waveform from the device under test, when the trigger return signal receiving means receives the trigger return signal.

The trigger return signal receiving means and the trigger signal supplying means may be a multiplexer circuit for obtaining each of a plurality of the trigger return signals from each of the plurality of testing modules, selecting one of the trigger return signals obtained from the first testing module, and supplying the selected trigger return signal to the second testing module as the trigger signal, and the operation order holding means may be a flip-flop circuit for holding a select signal for controlling the multiplexer circuit to select the trigger return signal.

The first testing module may perform first and second test operations in parallel, the operation order holding means may hold information indicating that the test operation by the second testing module should be performed after the first test operation by the first testing module, and information indicating that a test operation by a third testing module among the plurality of testing modules should be performed after the second test operation by the first testing module, the trigger return signal means may receive a first trigger return signal from the first testing module, the first trigger return signal indicating that the first testing module has completed the first test operation, when the first test operation of the first testing module has been completed, and a second trigger return signal from the first testing module, the second trigger return signal indicating that the first testing module has completed the second test operation, when the second test operation of the first testing module has been completed, and the trigger signal supplying means may supply a first trigger signal to the second testing module, the first trigger signal indicating that the second testing module should start the test operation thereof, when the trigger return signal receiving means receives the first trigger return signal, and a second trigger signal to the third testing module, the second trigger signal indicating that the third testing module should start the test operation thereof, when the trigger return signal receiving means receives the second trigger return signal.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
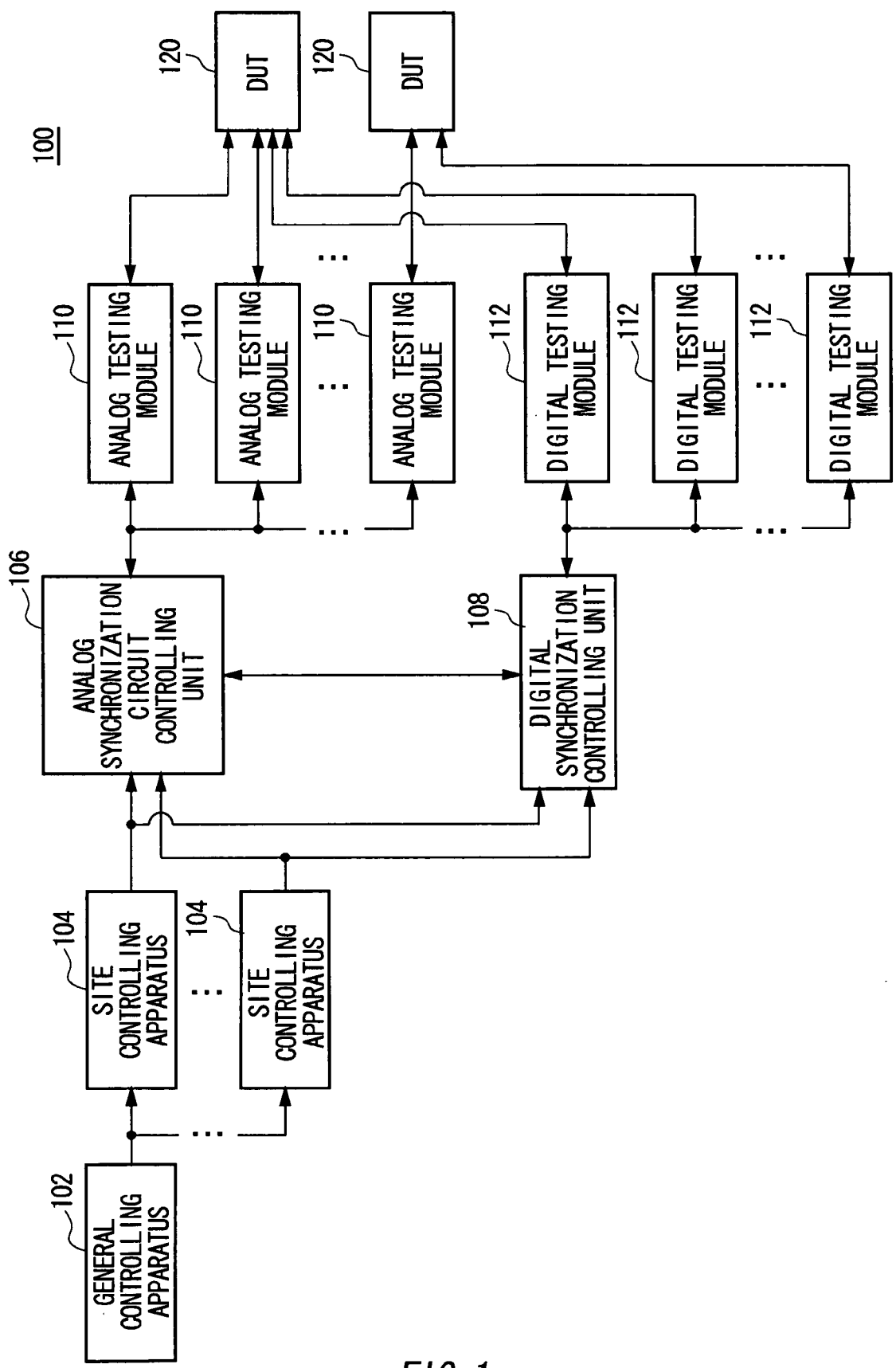
FIG. 1 shows an example of the configuration of a testing apparatus 100 related to an exemplary embodiment of the present invention.

FIG. 1 shows an example of the configuration of a testing apparatus 100 related to an exemplary embodiment of the present invention. The testing apparatus 100 includes a general controlling apparatus 102, site controlling apparatuses 104, analog synchronization circuit controlling units 106, digital synchronization controlling units 108, a plurality of analog testing modules 110 and a plurality of digital testing modules 112. The plurality of analog and digital testing modules 110 and 112 are an example of the testing modules of the present invention.

The testing apparatus 100 generates and supplies test signals to the devices under test 120, obtains the output signals outputted by the devices under test 120 as a result of their operations in response to the test signals, and judges the quality of the devices under test 120 based on the output signals. The testing apparatus 100 uses modules based on an open architecture as the analog or digital testing module 110 or 112 for supplying the test signal to the device under test 120. In other words, to a plurality of testing module slots, different types of analog or digital testing modules 110 or 112 for generating different types of test signals for the test of the devices under test 120 respectively are optionally mounted.

The general controlling apparatus 102 obtains and stores a test controlling program, a testing program, test data, etc. used for the test of the devices under test 120 via an external network. The site controlling apparatus 104 controls the analog and digital testing modules 110 and 112, and tests the plurality of devices under test 120 in parallel at the same time. The connection relation between the site controlling apparatus 104 and the analog and digital testing modules 110 and 112 is changed corresponding to the number of pins of the device under test 120, the wiring type of the performance board, the type of the analog and digital testing modules 110 and 112, etc. In other words, each of the plurality of site controlling apparatuses 104 performs a different test sequence in response to the performance of the devices under test 120 by dividing the plurality of analog and digital testing modules 110 and 112 into plural sites, and controlling the operation of the analog or digital testing module 110 or 112 included in each site.

The site controlling apparatus 104 obtains and executes the test controlling program from the general controlling apparatus 102. And, the site controlling apparatus 104 obtains the testing program and the test data used in the test of the device under test 120 based on the test controlling program, and supply them to the analog or digital testing module 110 or 112 used in the test of each of the devices under test 120. Then, the site controlling apparatus 104 instructs the analog or digital testing module 110 or 112 to start the test based on the testing program and the test data by supplying the trigger signal and the clock signal from the analog synchronization circuit controlling unit 106 to the analog or digital testing module 110 or 112. And, the site controlling apparatus 104 receives an interruption indicating the end of the test from the analog or digital synchronization controlling unit 106 or 108, and informs the general controlling apparatus 102 of it.

The analog synchronization circuit controlling unit 106 controls the test sequences by the analog testing modules 110 based on the control of the site controlling apparatus 104. For example, the analog synchronization circuit controlling unit 106 supplies the analog testing module 110 with the trigger signal to start the test operation of the device under test 120 and the clock signal to control the test operation, and receives the trigger return signal indicating the completion of the test operation of the analog testing module 110 from the analog testing module 110. In addition, the analog and digital synchronization controlling units 106 and 108 may hand over the trigger return signal to each other. For example, the digital synchronization controlling unit 108 may hand over the trigger return signal received from the digital testing module 112 to the analog synchronization circuit controlling unit 106, and the analog synchronization circuit controlling unit 106 may supply the trigger signal to the analog testing module 110 based on the trigger return signal received from the digital synchronization controlling unit 108.

Particularly, the analog synchronization circuit controlling unit 106 has a function as operation order holding means of the present invention, so that it can hold the information indicating that the test operation by a first testing module 110 among the plurality of analog testing modules 110 should be performed before the test operation by a first testing module 110 among the plurality of analog testing modules 110. For example, the analog synchronization circuit controlling unit 106 is set in advance by hardware before the test of the device under test 120 begins in order to supply the trigger signal to the second analog testing module 110 when receiving the trigger return signal from the first analog testing module 110. And, the analog synchronization circuit controlling unit 106 has a function as trigger return signal receiving means of the present invention and thus receives the trigger return signal indicating that the first analog testing module 110 completes its test operation, when the test operation of the first analog testing module 110 has been finished, from the first analog testing module 110. And, the analog synchronization circuit controlling unit 106 has a function as trigger supplying means of the present invention and thus supplies the second analog testing module 110 with the trigger signal indicating that the second analog testing module 110 should begin its test operation, when the trigger return signal receiving means receives the trigger return signal.

In addition, if the analog testing module 110 performs different types of testing operations in parallel for one or more devices under test 120, the analog synchronization circuit controlling unit 106 may operate in the following manner. The analog synchronization circuit controlling unit 106 has a function as the operation order holding means of the present invention and thus holds the information indicating that the first test operation by a first analog testing module 110 should be performed before the test operation by a second analog testing module 110, and the information indicating that the second test operation by the first analog testing module 110 should be performed before the test operation by the third analog testing module 110. And, the analog synchronization circuit controlling unit 106 has a function as the trigger return signal receiving means of the present invention and thus receives a first trigger return signal indicating that the first analog testing module 110 completes the first test operation, when the first test operation of the first analog testing module 110 has been finished, from the first analog testing module 110, and a second trigger return signal indicating that the first analog testing module 110 completes the second test operation, when the second test operation of the first analog testing module 110 has been finished, from the first analog testing module 110. And, the analog synchronization circuit controlling unit 106 has a function as the trigger signal supplying means of the present invention and thus supplies the second analog testing module 110 with a first trigger signal indicating that the second analog testing module 110 should begin its test operation, when the trigger return signal receiving means receives a first trigger return signal, and supplies the third analog testing module 110 with a second trigger signal indicating that the third analog testing module 110 should begin its test operation, when the trigger return signal receiving means receives a second trigger return signal.

As above, according to the testing apparatus 100 related to this embodiment, by supplying the trigger signal to a predetermined analog testing module 110 based on the trigger return signal received from a predetermined analog or digital testing module 110 or 112 during test operation, where the analog synchronization circuit controlling unit 106 is set in advance by hardware, the predetermined analog testing module 110 can start its operation, and a plurality of analog and digital testing modules 110 and 112 can operate in a desired order. Accordingly, although the analog and digital testing modules 110 and 112 mounted to the plurality of testing module slots are optionally changed, it is possible to reduce the work required to make the test program corresponding to the mounting positions or the combination of the testing modules, and to curtail the time required to test the devices under test. Further, the digital synchronization controlling unit 108 may control the test operation of the digital testing module 112 by functioning as the analog synchronization circuit controlling unit 106 described above.

Figure 2:
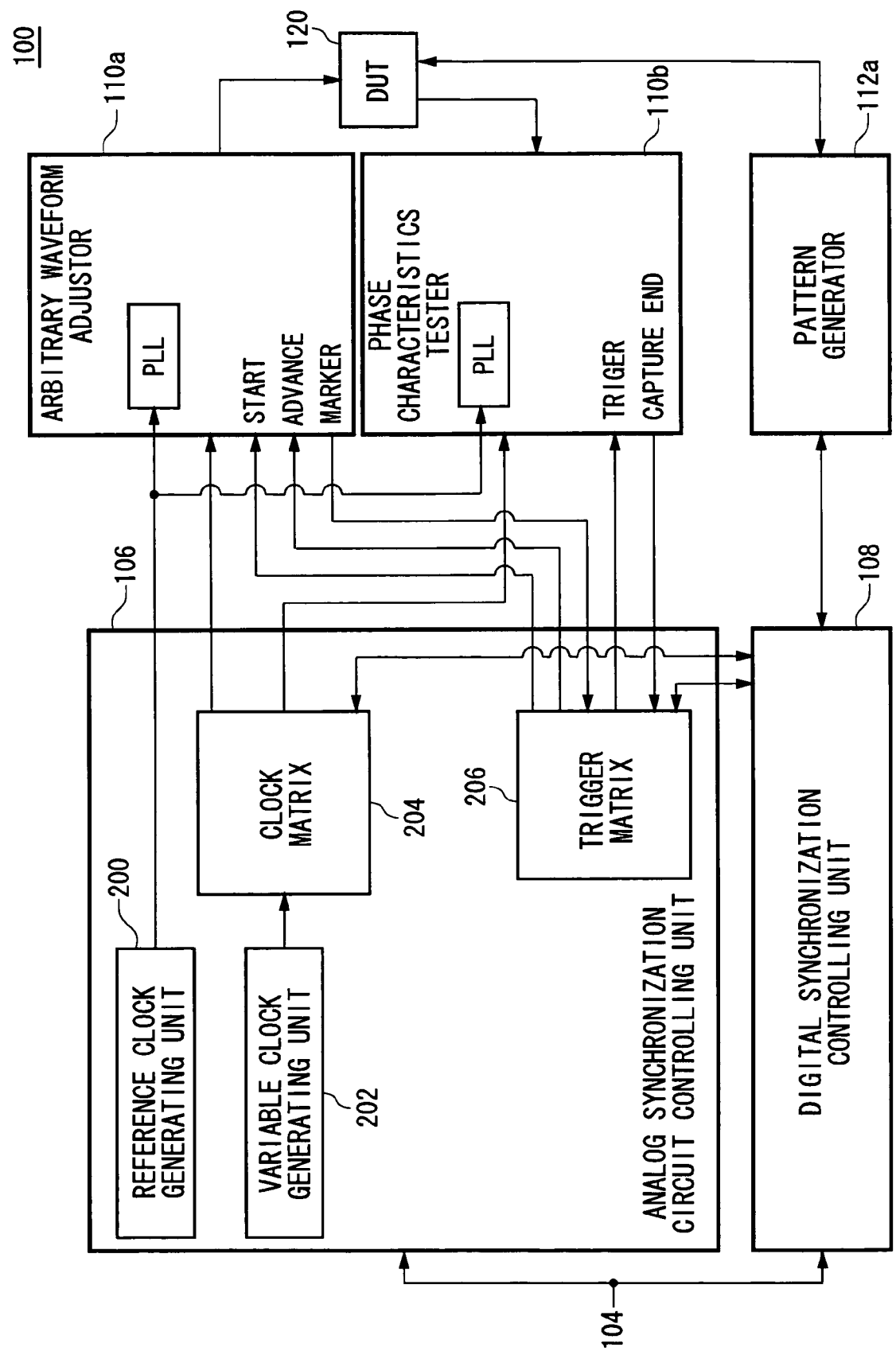
FIG. 2 shows an example of the detailed configuration of a testing apparatus 100 related to this embodiment.

FIG. 2 shows an example of the detailed configuration of the testing apparatus 100 related to this embodiment. The testing apparatus 100 includes an arbitrary waveform adjustor 110a and a phase characteristics tester 110b as the analog testing module 110, and a pattern generator 112a as the digital testing module 112. The analog synchronization circuit controlling unit 106 includes reference clock generating unit 200, a variable clock generating unit 202, a clock matrix 204, and a trigger matrix 206.

The arbitrary waveform adjustor 110a generates and supplies an arbitrary analog waveform to the device under test 120 based on the control of the analog synchronization circuit controlling unit 106. In addition, the phase characteristics tester 110b receives the analog waveform outputted by the device under test 120 in response to the analog waveform supplied from the arbitrary waveform adjustor 110a, and tests the phase characteristics of the analog waveform. The arbitrary waveform adjustor 110a and the phase characteristics tester 110b have PLL (Phase Locked Loop) circuits, and operate while generating internal clocks based on the reference clock generated by the reference clock generating unit 200. The pattern generating unit 112a sets the device under test 120 by generating and supplying a digital pattern to the device under test 120 based on the control of the digital synchronization controlling unit 108.

The clock matrix 204 is set with respect to hardware in advance before the test of the device under test 120, so that the connections of the input and the output are determined. In other words, which clock signal from the variable clock generating unit 202, the digital synchronization controlling unit 108, the performance board, etc. is supplied to the arbitrary waveform adjustor 110a or the phase characteristics tester 110b is determined. In addition, the trigger matrix 206 is set with respect to hardware in advance before the test of the device under test 120, so that the connections of the input and the output are determined. In other words, when a trigger return signal from any of the arbitrary waveform adjustor 110a, the phase characteristics tester 110b, the pattern generator 112a, etc. is received, which the arbitrary waveform adjustor 110a or the phase characteristics tester lob the trigger signal is supplied to is determined.

That is, the trigger matrix 206 has a function as the operation order holding means of the present invention, and thus holds the information indicating that the supply operation of the arbitrary waveform adjustor 110a to the device under test 120 should be performed before the receiving operation of the phase characteristics tester 110b from the device under test 120. And, the trigger matrix 206 has a function as the trigger return signal receiving means, and thus receives a trigger return signal indicating that the arbitrary waveform adjustor 110a completes its supply operation, when the arbitrary waveform adjustor 110a has finished the supply operation of the analog waveform at a predetermined time, from the arbitrary waveform adjustor 110a. And, the trigger matrix 206 has a function as the trigger signal supplying means, and thus supplies a trigger signal indicating that the phase characteristics tester lob should begin its operation to receive the analog waveform from the device under test 120, when the trigger return signal receiving means has received the trigger return signal, to the phase characteristics tester 110b.

As above, by sequentially controlling the operations of the arbitrary waveform adjustor 110a and the phase characteristics tester 110b through receiving and sending the trigger return signal and the trigger signal, although there occurs a delay in applying the analog waveform to the device under test 120 by the arbitrary waveform adjuster 110a, the phase characteristics tester 110b does not start to receive the analog waveform as long as there occurs no trigger return signal from the arbitrary waveform adjustor 110a, whereby there isn't any disorder in the test sequences to allow the phase characteristics tester 110b to start to receive the analog waveform before the arbitrary waveform adjustor 110a finishes applying the analog waveform, while the arbitrary waveform adjustor 110a and the phase characteristics tester 110b can be operated in a proper order and with proper timing.

Figure 3:
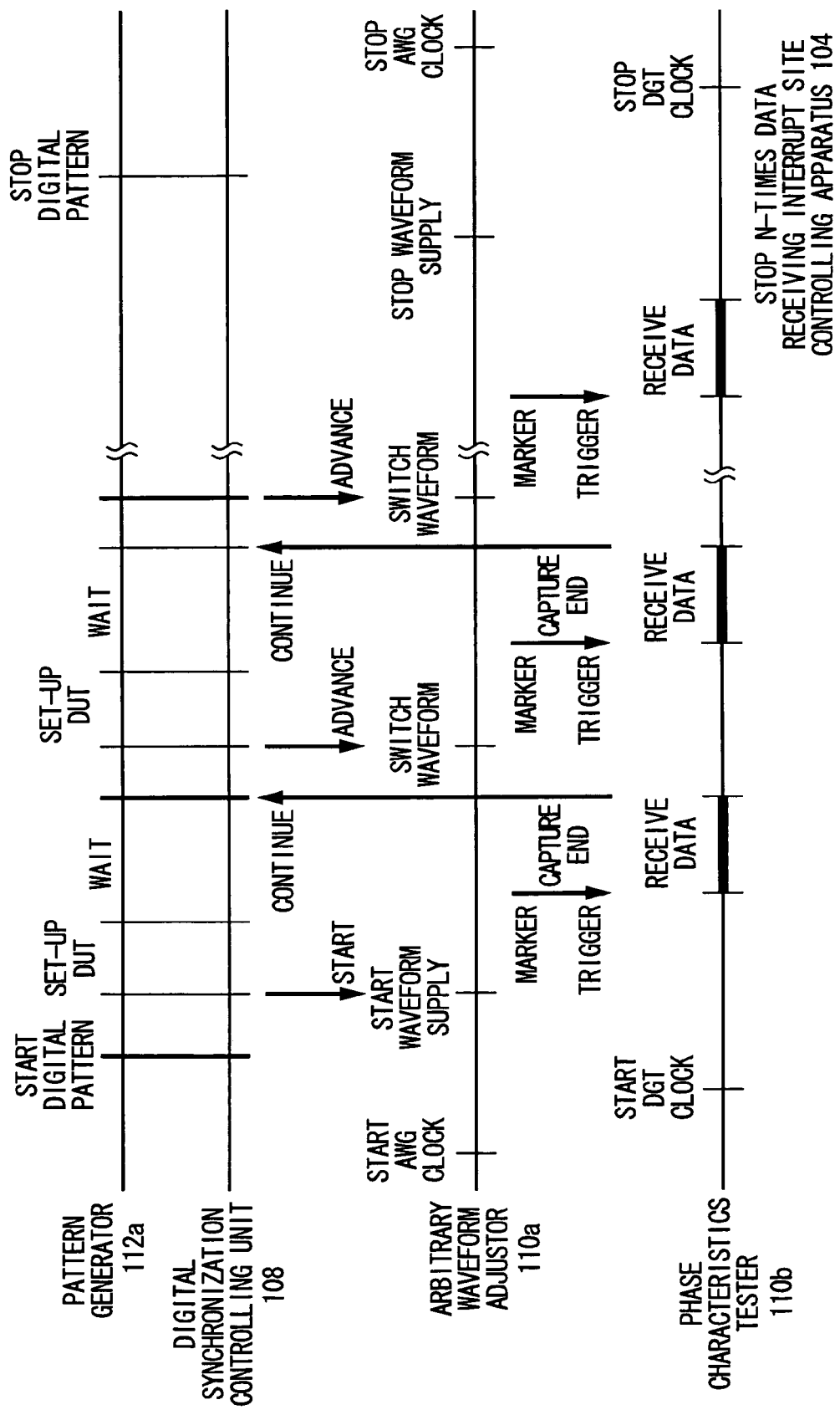
FIG. 3 shows an example of the operation sequence of a testing apparatus 100 related to this embodiment.

FIG. 3 shows an example of the operation sequence of the testing apparatus 100 related to this embodiment. First, the reference clock generating unit 200 makes the arbitrary waveform adjustor 110a and the phase characteristics tester 110b capable of operating by applying the reference clock to the arbitrary waveform adjustor 110a and the phase characteristics tester 110b. At this time, the arbitrary waveform adjustor 110a is in a wait state for a start signal as an example of the trigger signal, and the phase characteristics tester 110b is in a wait state for the trigger signal.

Then, the pattern generator 112a generates and supplies a digital pattern to the device under test 120 based on the control of the digital synchronization controlling unit 108, and sets up the device under test 120. The pattern generator 112a turns into the wait state when the set-up of device under test 120 is completed. Meanwhile, when the start signal is supplied to the arbitrary waveform adjustor 110a from the digital synchronization controlling unit 108 via the trigger matrix 206, the arbitrary waveform adjustor 110a generates the analog waveform stored in a pattern memory, and starts to supply the device under test 120. And, the arbitrary waveform adjustor 110a supplies a marker signal as an example of the trigger return signal to the trigger matrix 206, when finishing its supply operation at a predetermined time of the analog waveform to the device under test 120. The trigger matrix 206 supplies the trigger signal to the phase characteristics tester 110b, when receiving the marker signal from the arbitrary waveform adjustor 110a.

And, the phase characteristics tester 110b receives the analog waveform outputted from the device under test 120 in response to the analog waveform supplied from the arbitrary waveform adjustor 110a, when receiving the trigger signal from the trigger matrix 206. The phase characteristics tester 110b supplies a capture end signal as an example of the trigger signal to the trigger matrix 206, when finishing the receiving operation of the analog waveform outputted from the device under test 120. And, the trigger matrix 206 supplies a continue signal to the digital synchronization controlling unit 108, when receiving the capture end signal from the phase characteristics tester 110b. The digital synchronization controlling unit 108 allows the pattern generator 112a to generate a new digital signal and set up the device under test 120, when receiving the continue signal. The pattern generator 112a turns into the wait state, when the set-up of the device under test 120 is finished. In addition, the digital synchronization controlling unit 108 supplies an advance signal as an example of the trigger signal, when receiving the capture end signal from the trigger matrix 206. The trigger matrix 206 supplies the advance signal as an example of the trigger signal to the arbitrary waveform adjustor 110a, when receiving the advance signal from the digital synchronization controlling unit 108.

And, the arbitrary waveform adjustor 110a switches the analog waveform by generating the next analog waveform stored in the pattern memory and starts to supply the device under test 120, when receiving the advance signal from the trigger matrix 206. As above, by sequentially repeating the set-up operation of the pattern generator 112a, the supply operation of the arbitrary waveform adjustor 110a, and the receiving operation of the phase characteristics tester 110b, the output waveform of the device under test 120 is received by the phase characteristics tester 110b in response to each of the plurality of different analog waveforms. And, the phase characteristics tester 110b generates an interruption to the site controlling apparatus 104 and informs that the test sequence is finished, when a predetermined number of output waveforms have been received. And, the site controlling apparatus 104 stops the arbitrary waveform adjustor 110a supplying the analog waveform to the device under test 120, stops the digital synchronization controlling unit 108 operating, and stops the pattern generator 112a supplying the digital pattern to the device under test 120. And, the site controlling apparatus 104 stops the reference clock generating unit 200 supplying the reference clock to the arbitrary waveform adjustor 110a and the phase characteristics tester 110b.

As above, the trigger matrix 206 performs receiving and sending with regard to the start signal, the marker signal, the trigger signal, the capture end signal, the continue signal, or the advance signal from and to the arbitrary waveform adjustor 110a, the phase characteristics tester 110b, the pattern generator 112a, or the digital synchronization controlling unit 108 based on the predetermined hardware set-up. Accordingly, the testing apparatus 100 in this embodiment can operate the arbitrary waveform adjustor 110a, the phase characteristics tester 110b, and the pattern generator 112a in a desired order based on the testing program where the operation order of the arbitrary waveform adjustor 110a, the phase characteristics tester 110b, and the pattern generator 112a is not determined.

Figure 4:
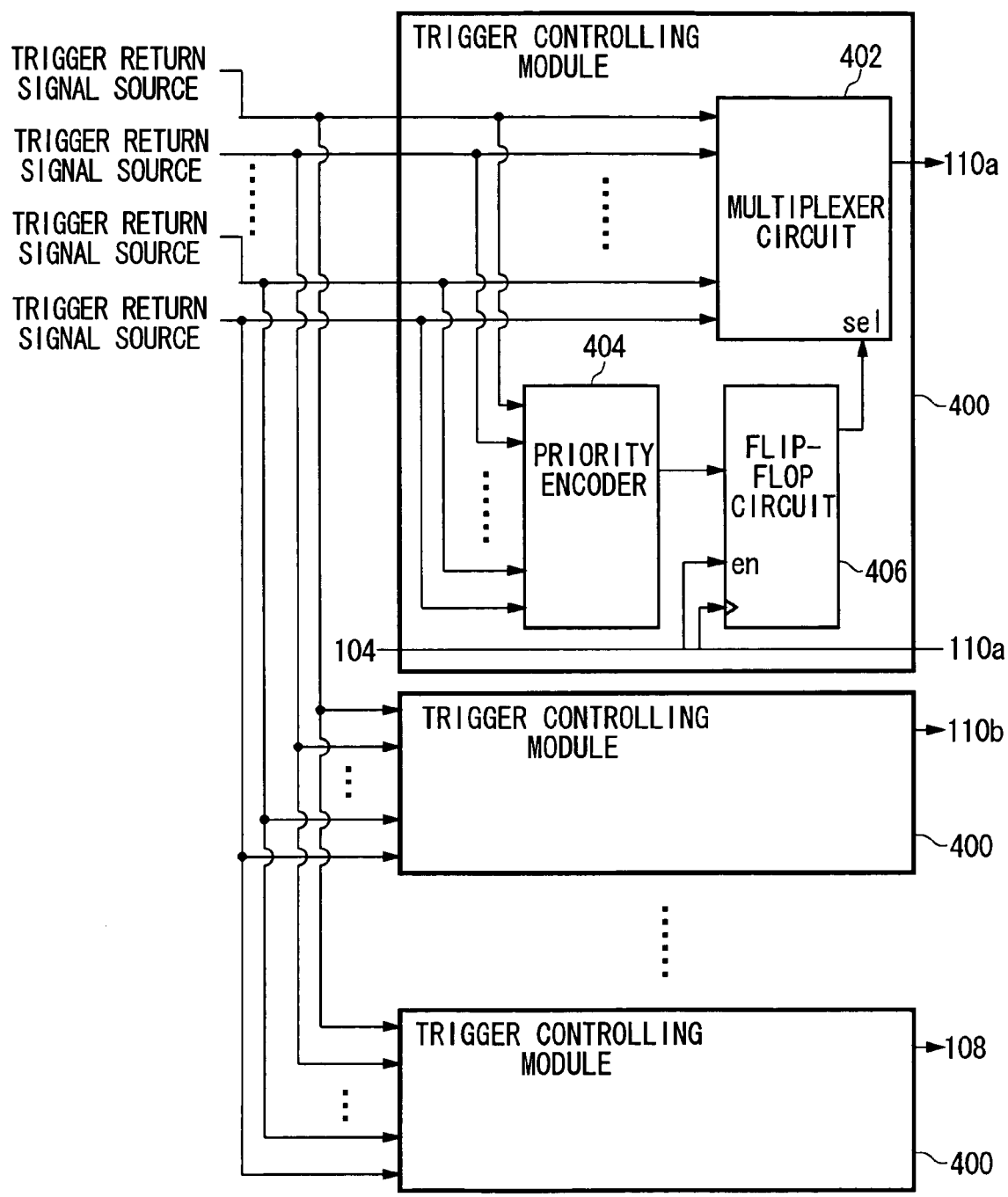
FIG. 4 shows an example of the configuration of a trigger matrix 206 related to this embodiment.

FIG. 4 shows an example of the configuration of the trigger matrix 206 related to this embodiment. The trigger matrix 206 includes a plurality of trigger controlling modules 400. Each of the trigger controlling modules 400 includes a multiplexer circuit 402, a priority encoder 404, and a flip-flop circuit 406. Each of the trigger controlling modules 400 is coupled to the plurality of analog testing modules 110 respectively such as the arbitrary waveform adjustor 110a and the phase characteristics tester 110b, and supplies the trigger signal to each of the plurality of analog testing modules in response to the supplied trigger return signal.

First, the hardware set-up of the trigger controlling module 400 before the test of the device under test 120 begins will be described. When a status signal is supplied to the trigger controlling module 400 by at least one of trigger return signal sources based on an instruction of the site controlling apparatus 104, the priority of encoder 404 receives signals supplied from the plurality of trigger return signals via a plurality of interfaces respectively, and calculates and supplies the status information indicating which trigger return signal source supplies the status signal to the flip-flop circuit 406. And, when an enable signal is supplied to the flip-flop circuit 406 by the arbitrary waveform adjustor 110a based on an instruction of the site controlling unit 104, and a set-up request signal is supplied from the site controlling unit 104 to the flip-flop circuit 406, the flip-flop circuit 406 holds the status information being supplied from the priority encoder 404 when the set-up request signal is supplied as a select signal for controlling the multiplexer circuit 402 to select the control signal based on the set-up request signal. Accordingly, the hardware set-up of the trigger controlling module 400 is performed, and the connections of the input and the output are determined. Here, as the trigger return signal sources, there is the digital synchronization controlling unit 108, the arbitrary waveform adjustor 110a, the phase characteristics tester 110b, the performance board, etc.

Next, the operation of the trigger controlling module 400 during the test of the device under test 120 will be described. The flip-flop circuit 406 supplies the status information held before the start of the test as described above to the multiplexer circuit 402 as the select signal. And, the multiplexer circuit 402 is functioning as the trigger return signal receiving means of the present invention, and obtains a plurality of trigger return signals supplied from each of the plurality of trigger return signal sources based on an instruction of the site controlling apparatus 104. And, the multiplexer circuit 402 is functioning as the trigger signal supplying means of the present invention, and selects the trigger return signal obtained from each of the trigger return signal sources, a plurality of trigger return signals, the digital synchronization controlling unit 108 or the phase characteristics tester 110b based on the select signal supplied from the flip-flop circuit 406, and supplies it to the arbitrary waveform adjustor 110a as the trigger signal.

According to the trigger controlling module 400 related to this embodiment, before the start of the test of device under test 120, the priority encoder 404 generates status information, and the flip-flop circuit 406 holds it as the select signal, whereby the hardware set-up of the trigger controlling module 400 is performed, and the test can be performed by properly selecting the trigger signal source in response to the arbitrary waveform adjustor 110a and the phase characteristics tester 110b.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus which comprises a plurality of testing module slots to which different types of testing modules for testing a device under test are optionally mounted, comprising:
   a first testing module;
   a second testing module; and
   a synchronization controlling unit provided separately from said first testing module and said second testing module, said synchronization controlling unit comprising:
      operation order holding means for holding information indicating that a test operation by said first testing module among said plurality of testing modules should be performed before a test operation by said second testing module among said plurality of testing modules;
      trigger return signal receiving means for receiving a trigger return signal from said first testing module; and
      trigger signal supplying means for supplying a trigger signal to said second testing module, said trigger signal indicating that said second testing module should start said test operation thereof, when said trigger return signal receiving means receives said trigger return signal.

2. A testing apparatus as claimed in claim 1, wherein said first testing module is an arbitrary waveform adjustor for generating and supplying an arbitrary analog waveform to said device under test,
   said second testing module is a phase characteristics tester for receiving an analog waveform outputted by said device under test in response to said analog waveform supplied from said arbitrary waveform adjustor, and testing phase characteristics of said analog waveform,
   said operation order holding means holds information indicating that said phase characteristics tester should perform a receiving operation of said analog waveform from said device under test, after said arbitrary waveform adjustor performs a supply operation of said analog waveform to said device under test,
   said trigger return signal receiving means receives said trigger return signal from said arbitrary waveform adjustor, said trigger return signal indicating that said arbitrary waveform adjustor has completed said supply operation, when said supply operation at a predetermined time of said analog waveform has completed by said arbitrary waveform adjustor, and
   said trigger signal supplying means supplies said trigger signal to said phase characteristics tester, said trigger signal indicating that said phase characteristics tester should start said receiving operation of said analog waveform from said device under test, when said trigger return signal receiving means receives said trigger return signal.

3. A testing apparatus as claimed in claim 1, wherein said trigger return signal receiving means and said trigger signal supplying means are a multiplexer circuit for obtaining each of a plurality of said trigger return signals from each of said plurality of testing modules, selecting one of said trigger return signals obtained from said first testing module, and supplying said selected trigger return signal to said second testing module as said trigger signal, and
   said operation order holding means is a flip-flop circuit for holding a select signal for controlling said multiplexer circuit to select said trigger return signal.

4. A testing apparatus as claimed in claim 1, wherein said first testing module performs first and second test operations in parallel,
   said operation order holding means holds information indicating that said test operation by said second testing module should be performed after said first test operation by said first testing module, and information indicating that a test operation by a third testing module among said plurality of testing modules should be performed after said second test operation by said first testing module,
   said trigger return signal means receives a first trigger return signal from said first testing module, said first trigger return signal indicating that said first testing module has completed said first test operation, when said first test operation of said first testing module has been completed, and a second trigger return signal from said first testing module, said second trigger return signal indicating that said first testing module has completed said second test operation, when said second test operation of said first testing module has been completed, and
   said trigger signal supplying means supplies a first trigger signal to said second testing module, said first trigger signal indicating that said second testing module should start said test operation thereof, when said trigger return signal receiving means receives said first trigger return signal, and a second trigger signal to said third testing module, said second trigger signal indicating that said third testing module should start said test operation thereof, when said trigger return signal receiving means receives said second trigger return signal.

5. A testing apparatus as claimed in claim 1, wherein said trigger return signal receiving means receives a trigger return signal from said first testing module, when said test operation of said first testing module has been completed, said trigger return signal indicating that said first testing module has completed said test operation thereof.

* * * * *